(12) United States Patent
Taguchi (10) Patent No.: US 10,586,773 B2
(45) Date of Patent: Mar. 10, 2020

(54) SEMICONDUCTOR DEVICE

(71) Applicant: ABLIC Inc., Chiba-shi, Chiba (JP)

(72) Inventor: Yasuhiro Taguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/906,427

(22) Filed: Feb. 27, 2018

(65) Prior Publication Data
US 2018/0269165 A1    Sep. 20, 2018

(30) Foreign Application Priority Data

Mar. 17, 2017  (JP) .................................. 2017-052824

(51) Int. Cl.
| | | |
|---|---|---|
| *H01L 23/00* | (2006.01) | |
| *H01L 23/31* | (2006.01) | |
| *H01L 23/495* | (2006.01) | |
| *H02K 11/215* | (2016.01) | |
| *H01L 21/48* | (2006.01) | |
| *H01L 21/56* | (2006.01) | |
| *G01D 11/24* | (2006.01) | |

(52) U.S. Cl.
CPC .......... *H01L 23/562* (2013.01); *G01D 11/245* (2013.01); *H01L 21/4825* (2013.01); *H01L 21/565* (2013.01); *H01L 23/3107* (2013.01); *H01L 23/3114* (2013.01); *H01L 23/4952* (2013.01); *H01L 23/49513* (2013.01); *H01L 23/49541* (2013.01); *H02K 11/215* (2016.01); *H01L 2224/32245* (2013.01); *H01L 2224/48091* (2013.01); *H01L 2224/48257* (2013.01); *H01L 2224/48465* (2013.01); *H01L 2224/73265* (2013.01)

(58) Field of Classification Search
None
See application file for complete search history.

(56) References Cited

U.S. PATENT DOCUMENTS 6,724,347 B2 * 4/2004 Tomamatsu ........ B29C 45/0025
343/700 MS

FOREIGN PATENT DOCUMENTS

JP    H06-213741 A    8/1994

* cited by examiner

*Primary Examiner* — Long Pham
(74) *Attorney, Agent, or Firm* — Brinks Gilson & Lione (57) ABSTRACT

Provided is a semiconductor device having a single inline package with high vibration resistance. External terminals (2a to 2c) are extracted from a resin encapsulation body (3) including a magnetic sensor and other semiconductor elements, a resin protruded portion is formed between the external terminal and the adjacent external terminal, and a gap is formed between the resin protruded portion and the external terminal. When the semiconductor device is mounted on a mounting substrate, the resin protruded portion is fixed on a surface of the mounting substrate, and the external terminal is bonded to a hole formed in the mounting substrate.

19 Claims, 14 Drawing Sheets

SEMICONDUCTOR DEVICE

RELATED APPLICATIONS

This application claims priority under 35 U.S.C. § 119 to Japanese Patent Application No. 2017-052824 filed on Mar. 17, 2017, the entire content of which is hereby incorporated by reference.

BACKGROUND OF THE INVENTION

1. Field of the Invention

The present invention relates to a semiconductor device having a single inline package.

2. Description of the Related Art

For driving an automobile, it is demanded to enhance rotation accuracy of a brushless motor or an engine of the automobile by sensing the rotating state thereof and feeding the result of the sensing back to control the rotation. In order to meet the demand, there is required a sensor element, for example, a magnetic sensor, for sensing rotation of the brushless motor or the automobile engine. The sensor element is combined with a semiconductor integrated circuit and is encapsulated in a semiconductor package. As a semiconductor package housing the sensor element, a pin-insertion type package, that is, a so-called single inline package, is commonly known. The single inline package is hereinafter abbreviated to "SIP".

The SIP includes a resin body and at least three external terminals extracted from the resin body formed through resin-encapsulation. A length of the external terminal is at least twice or more as long as that of the resin body, and even after insertion of the SIP to a substrate, most part of the external terminal is exposed from the substrate. Mounting of the SIP to the substrate with most part of the external terminal exposed causes transference of vibration of a natural frequency due to the rotation of the automobile engine or the brushless motor to the external terminal. Since the resin body is kept apart from the mounting substrate via the external terminal, its mounting position is relatively high. Accordingly, the resin body is liable to repeatedly receive vibration from the brushless motor or the automobile engine. Repeated receiving of vibration causes concentration of stress at the external terminal of the SIP, resulting in frequent occurrence of a loss of the external terminal itself and of a crack in solder for fixing and connecting the substrate and the SIP. Occurrence of such failures causes disconnection between the mounting substrate and a circuit of the SIP, resulting in possible drawbacks such as stop of the engine in operation or burning of the substrate and other components by temperature rise due to stop of a cooling fan.

In order to solve the above-mentioned failures, a SIP with high vibration resistance has been proposed as described in, for example, Japanese Patent Application Laid-open No. H 6-213741.

Use of a technology described in Japanese Patent Application Laid-open No. H 6-213741 decreases influence of vibration. Since a stand-off portion of the external terminal is exposed and a vibration load is received at the stand-off portion, the influence of vibration remains considerably. Accordingly, there is room for improvement of the vibration resistance.

SUMMARY OF THE INVENTION

In view of the foregoing, the present invention provides a semiconductor device having a single inline package with high vibration resistance.

In order to achieve the semiconductor device, according to one embodiment of the present invention, the following measure is used. There is provided a semiconductor device using a single inline package, the semiconductor device including: a resin protruded portion extended from a resin encapsulation body, a resin cut-out portion formed adjacent to the resin protruded portion. An external terminal extending from one surface of the resin encapsulation body is arranged in the resin cut-out portion. A distal end of the external terminal is located farther from the resin encapsulation body than a distal end of the resin protruded portion.

Through use of the above-mentioned measure, it is possible to provide the semiconductor device having a single inline package that suppresses the influence of vibration from the outside, and has higher vibration resistance.

DETAILED DESCRIPTION OF THE EMBODIMENTS

Now, a semiconductor device of the present invention is described with reference to the drawings.

Figure 1:
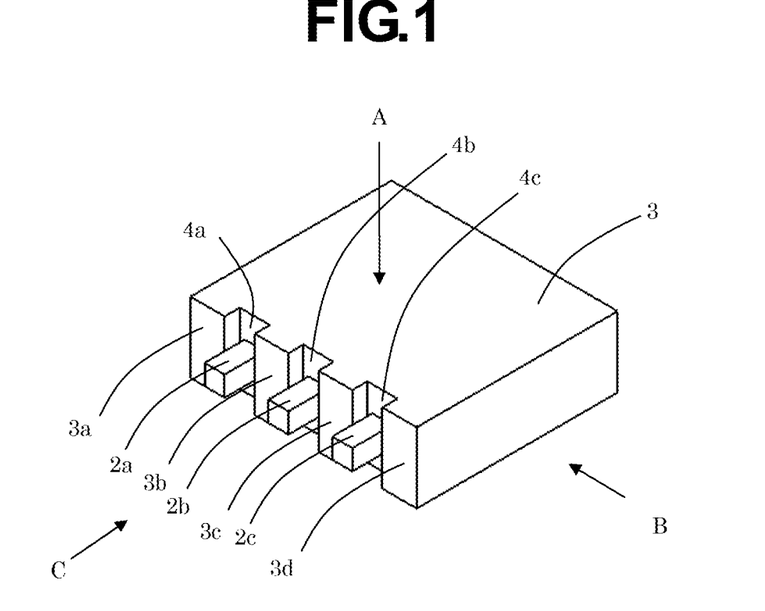
FIG. 1 is a bird's-eye view of a semiconductor device according to a first embodiment of the present invention.

FIG. 1 is a bird's-eye view of a semiconductor device according to a first embodiment of the present invention. The semiconductor device includes: a resin encapsulation body 3 in which a sensor element that includes, for example, a magnetic sensor, an angular velocity sensor, and other sensors or a non-sensor element that does not include a magnetic sensor, an angular velocity sensor, and other sensors (those elements are hereinafter collectively referred to as "semiconductor element"); resin protruded portions 3a, 3b, 3c, and 3d, which protrude from a bottom surface of the resin encapsulation body 3 being a surface on a left front side of the resin encapsulation body 3 on the drawing sheet; and external terminals 2a, 2b, and 2c. Between the adjacent resin protruded portions 3a, 3b, 3c, and 3d, resin cut-out portions 4a, 4b, and 4c, which are portions where no resin is present, are formed, and the external terminals 2a, 2b, and 2c are formed in the resin cut-out portions 4a, 4b, and 4c, respectively. The external terminals 2a, 2b, and 2c are arranged in a line, and construct a single inline package. Although not shown, the external terminals 2a, 2b, and 2c are electrically connected to the semiconductor element encapsulated in the resin encapsulation body 3.

Figure 2A:
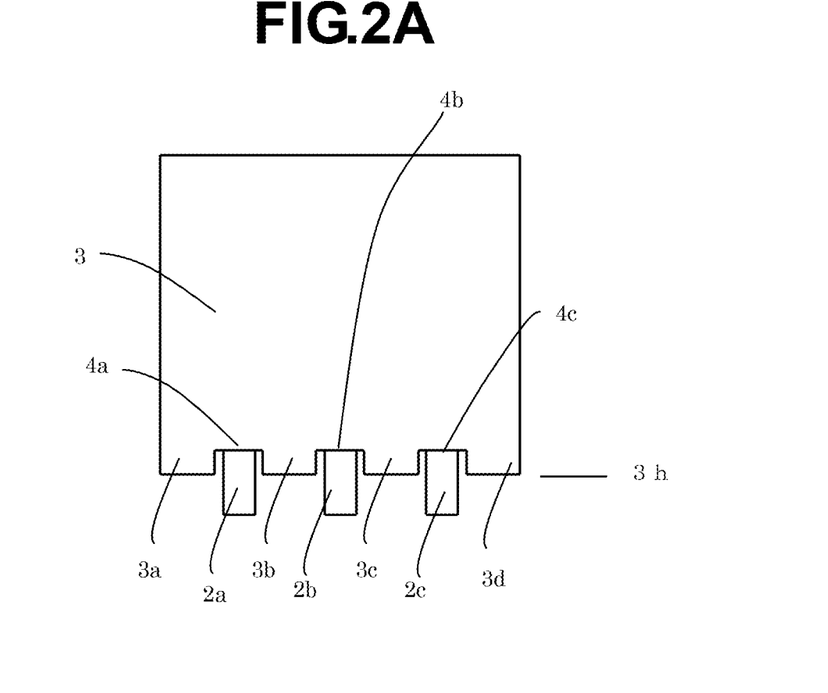
FIG. 2A, FIG. 2B, and FIG. 2C are plan views for illustrating the semiconductor device according to the first embodiment of the present invention, which is seen from respective directions.
Figure 2B:
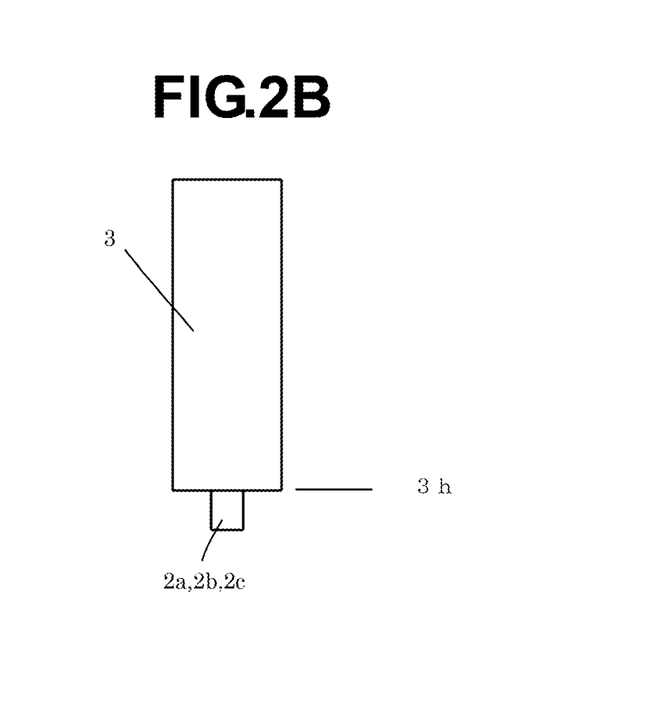
Figure 2C:
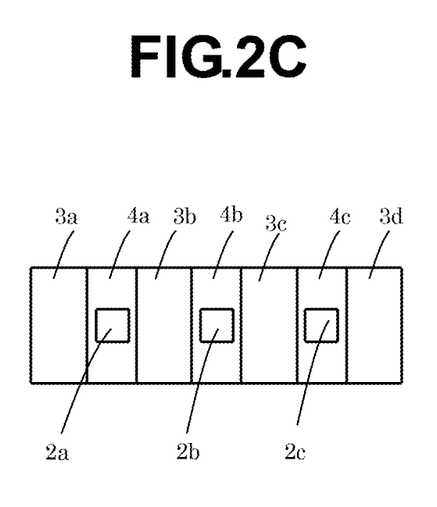

FIG. 2A, FIG. 2B, and FIG. 2C are plan views for illustrating the semiconductor device according to the first embodiment of the present invention of FIG. 1, in which FIG. 2A is a view of the semiconductor device seen from a direction A, FIG. 2B is a view of the semiconductor device seen from a direction B, and FIG. 2C is a view of the semiconductor device seen from a direction C.

In FIG. 2A, the semiconductor device is illustrated with the external terminals 2a, 2b, and 2c facing downward. A mounting surface at the time of mounting the semiconductor device on a substrate is a lower surface of FIG. 2A. The resin protruded portions 3a, 3b, 3c, and 3d protrude from the lower surface of the resin encapsulation body 3. The resin cut-out portion 4a, the resin cut-out portion 4b, and the resin cut-out portion 4c, which have a U-shape, are formed between the resin protruded portions 3a and 3b, between the resin protruded portions 3b and 3c, and between the resin protruded portions 3c and 3d, respectively. The external terminals 2a, 2b, and 2c extracted from the resin encapsulation body 3 are formed in the U-shaped resin cut-out portions 4a, 4b, and 4c, respectively. Base portions of the external terminals 2a, 2b, and 2c, which are in contact with the resin encapsulation body 3, are stored in the resin cut-out portions 4a, 4b, and 4c. Distal ends of the external terminals 2a, 2b, and 2c are located farther from the resin encapsulation body 3 than a distal end 3h of the resin protruded portion. The resin cut-out portions 4a, 4b, and 4c have a width larger than that of the external terminals 2a, 2b, and 2c. A gap is present between an inner side surface of the resin cut-out portion and a side surface of the external terminal, and this gap has a sufficient width and a sufficient height to store, at the time of mounting the semiconductor device on the substrate, a solder fillet formed above the resin protruded portion distal end 3h. When the external terminal has a width of 0.4 mm, it is sufficient that the gap between the inner side surface of the resin cut-out portion (side surface of the resin protruded portion) and the side surface of the external terminal is at least 0.1 mm. In general, it is preferred that a gap of from 0.1 mm to 0.2 mm, that is, a gap having a length of from one fourth to one half with respect to the width of the external terminal, would be present.

FIG. 2B is a view of the semiconductor device seen from the direction B of FIG. 1. The resin protruded portion distal end 3h is a surface that comes in contact with the substrate at the time of mounting the semiconductor device. Portions of the external terminals 2a, 2b, and 2c, which are located farther from the resin encapsulation body 3 than a distal end 3h of the resin protruded portion, are inserted or fitted into holes formed in the substrate, and thus the semiconductor device is mounted.

FIG. 2C is a view of the semiconductor device seen from the direction C of FIG. 1. The resin cut-out portion and the external terminal are arranged as a pair, such as the resin cut-out portion 4a and the external terminal 2a, the resin cut-out portion 4b and the external terminal 2b, and the resin cut-out portion 4c and the external terminal 2c. Further, the external terminals 2a, 2b, and 2c are arranged in a straight line. In the first embodiment, description is given of a case in which there are three external terminals, but the number of resin cut-out portions increases in accordance with an increase in number of external terminals.

Next, a method of manufacturing the semiconductor device according to the first embodiment of the present invention is described with reference to FIG. 3A to FIG. 3C and FIG. 4A and FIG. 4B.

Figure 3A:
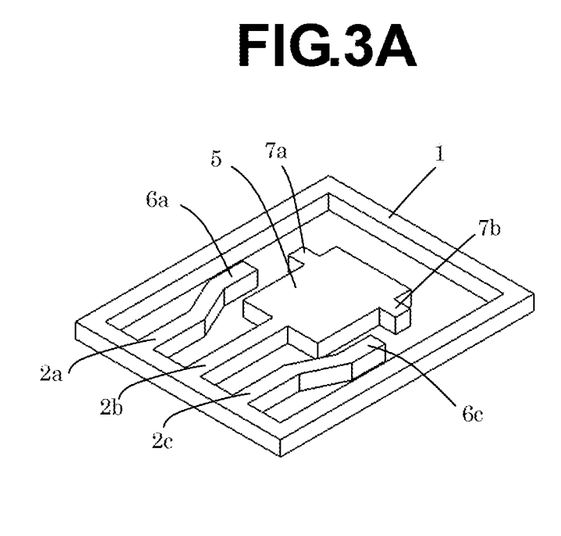
FIG. 3A, FIG. 3B, and FIG. 3C are bird's-eye views for illustrating a method of manufacturing the semiconductor device according to the first embodiment of the present invention.

As illustrated in FIG. 3A, the external terminals 2a, 2b, and 2c are connected to a side of a lead frame rim 1. An island 5 on which a semiconductor element 9 is to be mounted is connected to the external terminal 2b, and extended internal terminals 7a and 7b are arranged at end portions of the island 5. Further, internal terminals 6a and 6c extended from the external terminals 2a and 2c are formed in the vicinity of the island 5 while being separated from the island 5. As a material of a lead frame, a 194 alloy or a copper alloy is used in general.

Figure 3B:
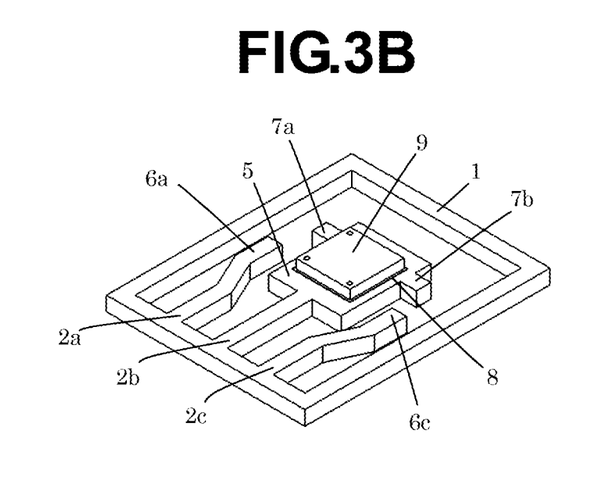

FIG. 3B is a view after a die bonding process, for illustrating a state in which the semiconductor element 9 is attached on a surface of the island 5 via a die-attach material 8.

Figure 3C:
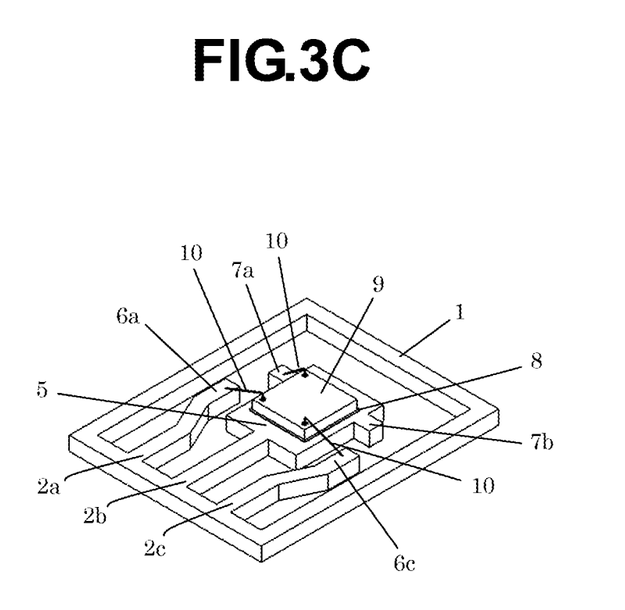

FIG. 3C is a view after a wire bonding process, for illustrating electrode pads on a surface of the semiconductor element 9 and the internal terminals 6a, 6c, and 7a are electrically connected to each other via wires 10. In FIG. 3C, the internal terminal 7a extended from the island 5 and the semiconductor element 9 are connected to each other via the wire 10, but the semiconductor element 9 may be connected to the internal terminal 7b extended from the island 5 in view of an arrangement state of the electrode pads on the semiconductor element 9.

Figure 4A:
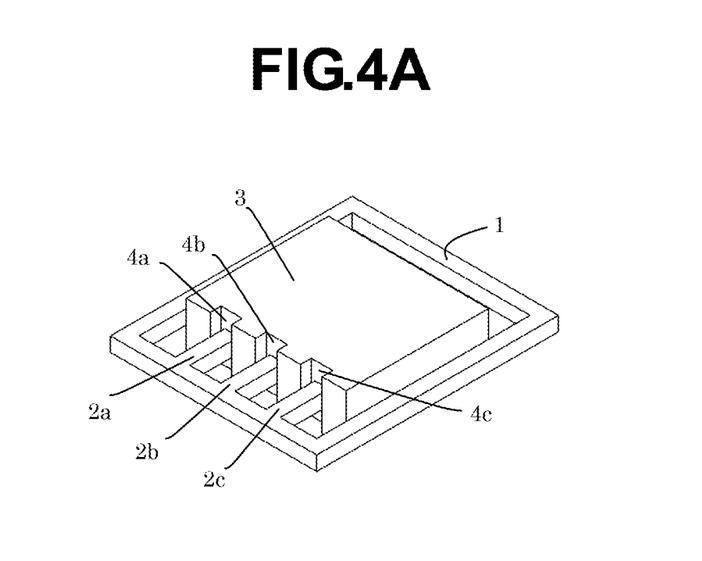
FIG. 4A and FIG. 4B are bird's-eye views subsequent to FIG. 3C, for illustrating the method of manufacturing the semiconductor device according to the first embodiment of the present invention.
Figure 4B:
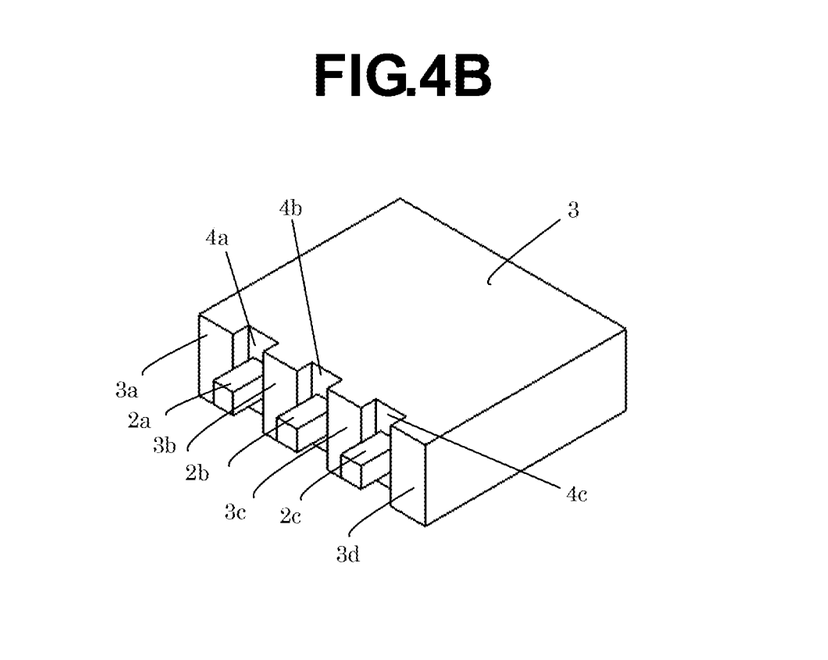

FIG. 4A and FIG. 4B are bird's-eye views subsequent to FIG. 3C, for illustrating the method of manufacturing the semiconductor device according to the first embodiment of the present invention.

FIG. 4A is a view for illustrating a state in which the semiconductor element 9 mounted on the island 5, the internal terminals 6a, 6c, and 7a, and the wires 10 are encapsulated in the resin encapsulation body 3. The lead frame rim 1 and the external terminals 2a, 2b, and 2c are exposed from the resin encapsulation body 3. The resin cut-out portions 4a, 4b, and 4c are formed so as to surround, from three directions, the base portions at which the external terminals 2a, 2b, and 2c are in contact with the resin encapsulation body 3.

Next, solder plating is performed on entire surfaces of the lead frame rim 1 and the external terminals 2a, 2b, and 2c, and the lead frame rim 1 is cut off at the distal ends of the external terminals 2a, 2b, and 2c. In this manner, the semiconductor device of the present invention, which is illustrated in FIG. 4B, is finished.

This semiconductor device includes, on one surface of the resin encapsulation body 3, unevenness formed of the resin protruded portions 3a, 3b, 3c, and 3d and the resin cut-out portions 4a, 4b, and 4c, and shows an outer appearance in which the external terminals 2a, 2b, and 2c are arranged in the resin cut-out portions 4a, 4b, and 4c of the resin encapsulation body 3.

Figure 5:
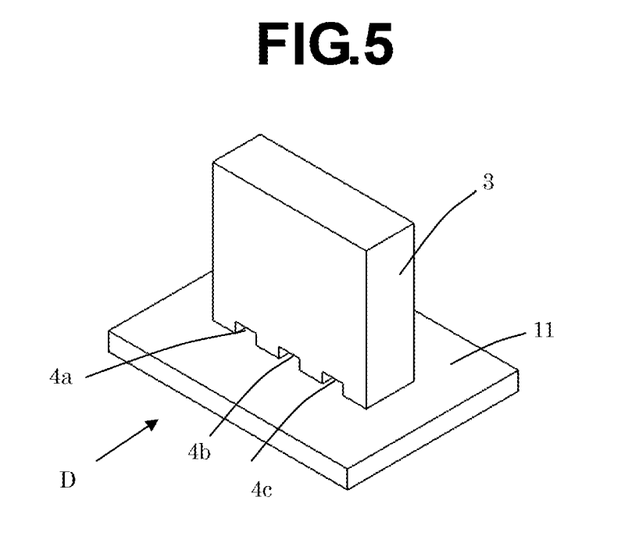
FIG. 5 is a bird's-eye view for illustrating a state in which the semiconductor device according to the first embodiment of the present invention is mounted on a mounting substrate.

FIG. 5 is a bird's-eye view for illustrating a state in which the semiconductor device according to the first embodiment of the present invention is mounted on the mounting substrate. The mounting substrate 11 is prepared, and the semiconductor device is mounted so that a surface of the mounting substrate 11 and the uneven surface of the resin encapsulation body 3 face each other to be in contact with each other.

Figure 6:
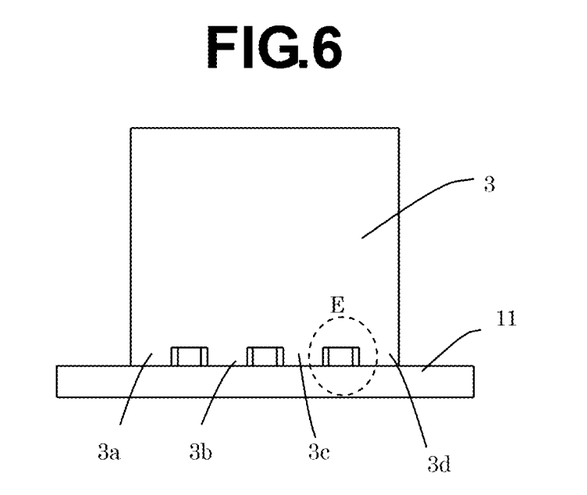
FIG. 6 is a view for illustrating the semiconductor device according to the first embodiment of the present invention of FIG. 5, in which the semiconductor device is seen from a direction D.
Figure 7:
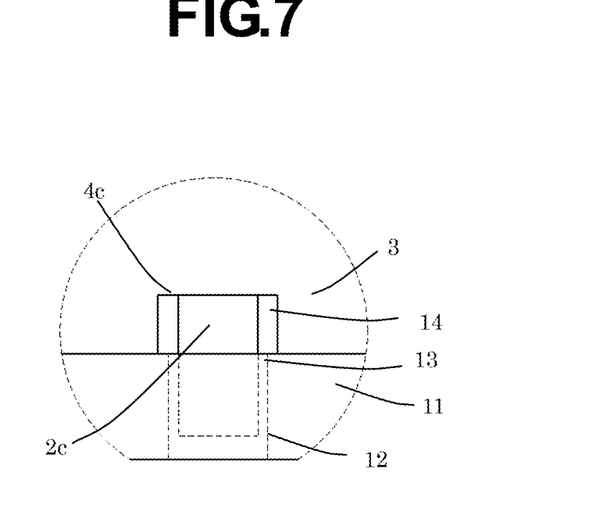
FIG. 7 is an enlarged view of a portion E of FIG. 6.

FIG. 6 is a view for illustrating the semiconductor device according to the first embodiment of the present invention of FIG. 5, in which the semiconductor device is seen from a direction D. Further, FIG. 7 is an enlarged view of a portion E (portion circled with dotted line) of FIG. 6.

The external terminals 2a, 2b, and 2c extracted from the resin encapsulation body 3 of the semiconductor device of the present invention, which is mounted on the mounting substrate 11, have a little more than half of their lower portions, which are inserted into holes 12 for wiring formed in the mounting substrate 11 and are bonded to the holes 12 for wiring via solder 13 for mounting a substrate. A length of the bonded portions of the external terminals 2a, 2b, and 2c is set equal to or slightly shorter than a depth of the holes 12 for wiring so that the external terminals 2a, 2b, and 2c are prevented from protruded from a back surface of the mounting substrate 11. Further, the resin protruded portions 3a to 3d, which construct the uneven surface being the bottom surface of the resin encapsulation body 3, are in contact with the mounting substrate 11 to be fixed thereto. The distal ends of the resin protruded portions 3a to 3d are located at the same height so as to be in contact with the mounting substrate 11 evenly.

Further, the external terminals 2a, 2b, and 2c have a little less than half of their upper portions, which are located above the mounting substrate 11 and are surrounded by the resin protruded portions 3a to 3d. Solder fillets having risen from the solder 13 for mounting a substrate are formed on side surfaces of the external terminals 2a, 2b, and 2c, and thus the gaps between the external terminals 2a, 2b, and 2c and the resin protruded portions 3a to 3d formed in the resin encapsulation body 3 are filled with the solder fillets. Consequently, upper portions of the external terminals 2a, 2b, and 2c and the resin protruded portions 3a to 3d are joined via the solder fillets.

As described above, when the semiconductor device according to the first embodiment of the present invention is mounted on the mounting substrate, not only the mounting substrate and the external terminals are bonded to each other, but also the mounting substrate and the resin protruded portions are in contact to be fixed to each other. In addition, the resin protruded portions and the external terminals are connected to each other via the solder fillets. Accordingly, even when the semiconductor device is repeatedly applied with vibration from the outside, the external terminals are hardly damaged, and solder cracks hardly occur.

Figure 8A:
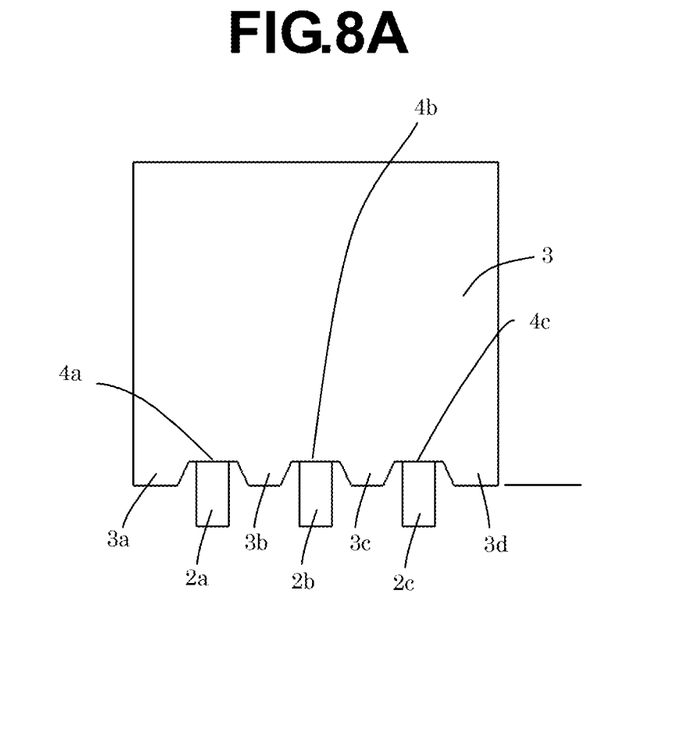
FIG. 8A, FIG. 8B, and FIG. 8C are plan views of a semiconductor device according to a second embodiment of the present invention.

FIG. 8A is a plan view of a semiconductor device according to a second embodiment of the present invention.

Figure 8B:
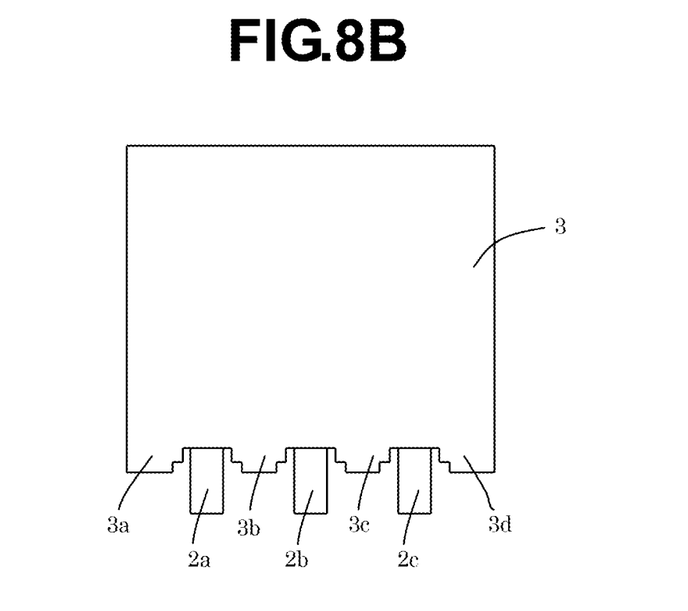
Figure 8C:
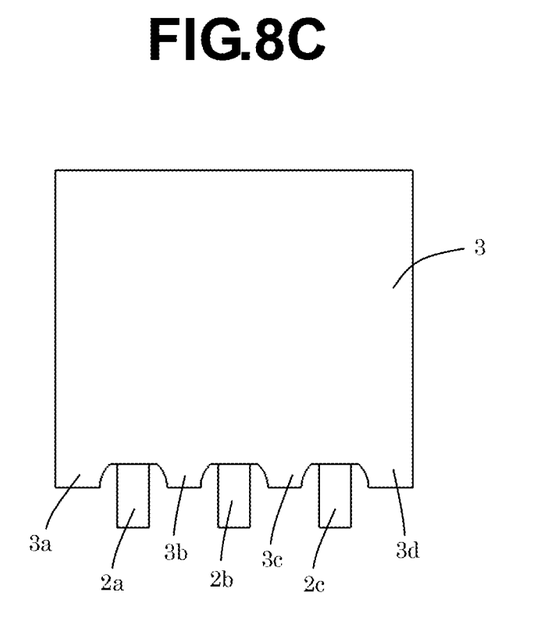

In FIG. 2A, the side surfaces of the external terminals 2a, 2b, and 2c and the inner side surfaces of the resin cut-out portions 4a, 4b, and 4c, which face the side surfaces of the respective external terminals, are arranged in parallel to each other. In FIG. 8A, the inner side surfaces of the resin cut-out portions 4a, 4b, and 4c are formed into a tapered shape, and the gap formed by the resin cut-out portion and the external terminal is formed into a trapezoid that becomes gradually wider from the base portion of the external terminal. With this configuration, remaining portions of the solder 13 for mounting a substrate, which has been used for joining of the external terminals 2a, 2b, and 2c and the holes 12 for wiring, overflow from the holes 12 for wiring into the gaps. As a result, it is possible to avoid a failure in which the remaining portions of the solder 13 for mounting substrate penetrate between the resin protruded portions 3a to 3d and the mounting substrate. Each of FIG. 8B and FIG. 8C is a view of a modification example of FIG. 8A. In FIG. 8B and FIG. 8C, there are illustrated an example in which the inner side surfaces of the resin cut-out portions are formed to form a stepped shape that becomes wider from the base portions of the external terminals, and an example in which the inner side surfaces of the resin cut-out portions are formed to form an arc shape that becomes wider from the base portions of the external terminals, respectively. Similarly to the example of FIG. 8A, the semiconductor device of FIG. 8B and FIG. 8C has a configuration in which penetration of solder between the resin protruded portions 3a to 3d and the mounting substrate is prevented.

Figure 9A:
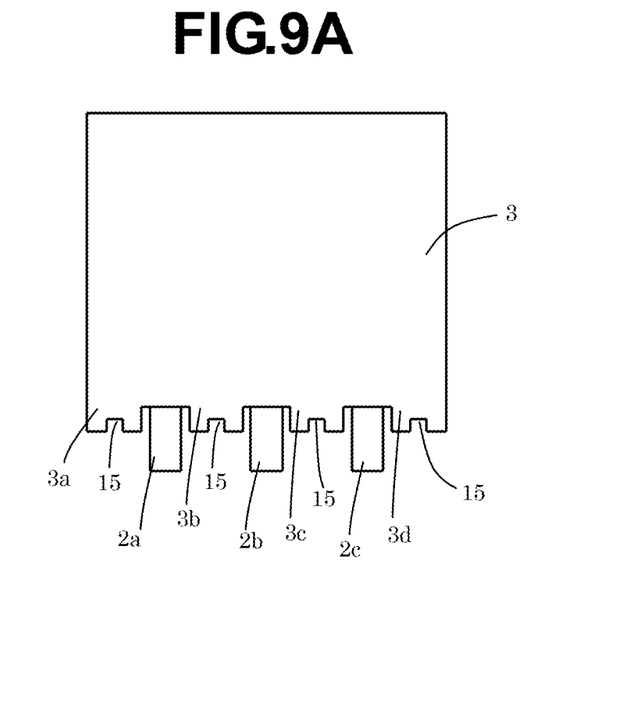
FIG. 9A, FIG. 9B, and FIG. 9C are plan views of a semiconductor device according to a third embodiment of the present invention.

FIG. 9A is a plan view of a semiconductor device according to a third embodiment of the present invention.

Figure 9B:
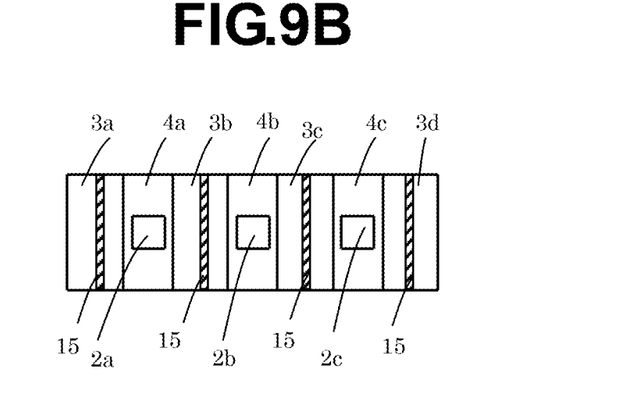
Figure 9C:
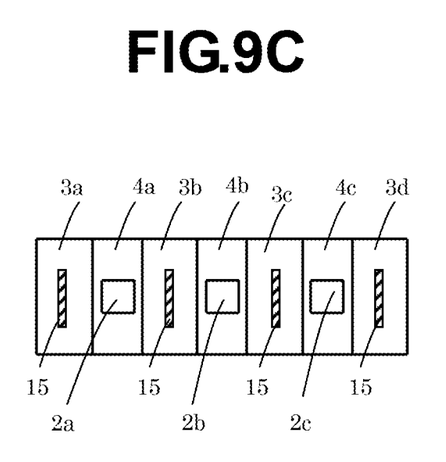

The semiconductor device of FIG. 9A differs from the semiconductor device of FIG. 2A in that a groove portion 15 is formed in the middle of the distal end of each of the resin protruded portions 3a to 3d. The groove portion 15 has a recess height set lower than that of the above-mentioned resin cut-out portions 4a to 4c, and is penetrated from the near side to the far side of the drawing sheet. FIG. 9B and FIG. 9C correspond to FIG. 2C, and are plan views for illustrating the semiconductor device seen from the bottom surface thereof, on which the external terminals are arranged. In FIG. 9B, the groove portions 15 each penetrate the resin protruded portions 3a to 3d from the upper side to the base being the opposite side. In addition, the groove portions 15 are formed perpendicularly to a direction in which the external terminals 2a, 2b, and 2c are arranged, and have a shape completely dividing the resin protruded portions 3a to 3d. In FIG. 9C, the groove portions 15 are formed in a part of the resin protruded portions 3a to 3d, and have a shape surrounded by the resin protruded portions 3a to 3d. A length (in a vertical direction of the drawing sheet) of the groove portions 15 is larger than a thickness (in a vertical direction of the drawing sheet) of the external terminals 2a, 2b, and 2c, and the groove portions 15 are formed on both sides of the external terminals 2a, 2b, and 2c. In the third embodiment, the external terminals 2a, 2b, and 2c have a thickness of 0.4 mm, and the groove portions 15 have a length of 0.6 mm. In FIG. 9B and FIG. 9C, there is illustrated a mode in which one groove portion is formed for one resin protruded portion, but, as described later with reference to FIG. 11A and FIG. 11B, a plurality of groove portions 15 may be formed for one resin protruded portion. With this configuration, it is possible to prevent solder overflowing from the hole for wiring from flowing to other places, by each of the groove portions 15 in the vicinity of the hole for wiring.

As described above, it is possible to avoid a short circuit between terminals by forming those groove portions even when solder penetrates between the resin protruded portions and the mounting substrate.

Figure 10A:
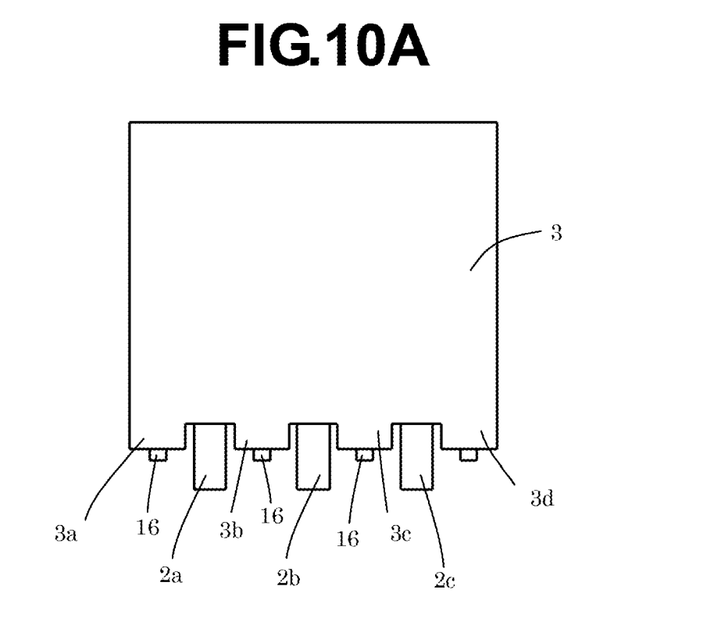
FIG. 10A and FIG. 10B are plan views of a semiconductor device according to a fourth embodiment of the present invention.

FIG. 10A is a plan view of a semiconductor device according to a fourth embodiment of the present invention.

Figure 10B:
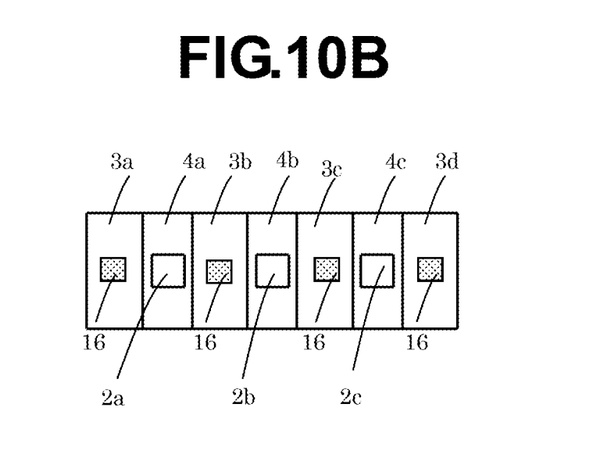

The semiconductor device of FIG. 10A differs from the semiconductor device of FIG. 2A in that a second resin protruded portion 16 is formed in the middle of the distal end of each of the resin protruded portions 3a to 3d. It is preferred that the second resin protruded portions 16 do not protrude further than the external terminals 2a, 2b, and 2c. In the opposing mounting substrate, holes are formed at positions corresponding to the second resin protruded portions 16, and those holes and the second resin protruded portions 16 are fitted with each other. With this, the semiconductor device according to the fourth embodiment of the present invention and the mounting substrate are joined more firmly. Those holes and the second resin protruded portions 16 may be simply fitted with each other, or may be joined via an insulating adhesive. FIG. 10B corresponds to FIG. 2C, and is a plan view for illustrating the semiconductor device seen from the bottom surface thereof, on which the external terminals are arranged. The second resin protruded portions 16 are formed on the resin protruded portions 3a to 3d so as to have an occupied area smaller than that of the resin protruded portions 3a to 3d. Influence of vibration on the external terminals 2a, 2b, and 2c can be suppressed by arranging the second resin protruded portions 16 as near as possible to the external terminals 2a, 2b, and 2c so that the external terminals 2a, 2b, and 2c and the second resin protruded portions 16 are located in a straight line. Further, it is desired that the external terminals 2a, 2b, and 2c and the second resin protruded portions 16 on both the sides of the external terminals 2a, 2b, and 2c would be arranged at equal intervals (symmetrically). Further, in FIG. 10A and FIG. 10B, there is illustrated a mode in which one second resin protruded portion 16 is formed for one resin protruded portion, but it is possible to achieve more firm junction by arranging a plurality of second resin protruded portions 16. Further, when there is any limitation on the arrangement of the holes corresponding to the second resin protruded portions 16, the second resin protruded portions 16 may not be formed on the resin protruded portions 3a and 3d, and may be formed only on the resin protruded portions 3b and 3c.

Figure 11A:
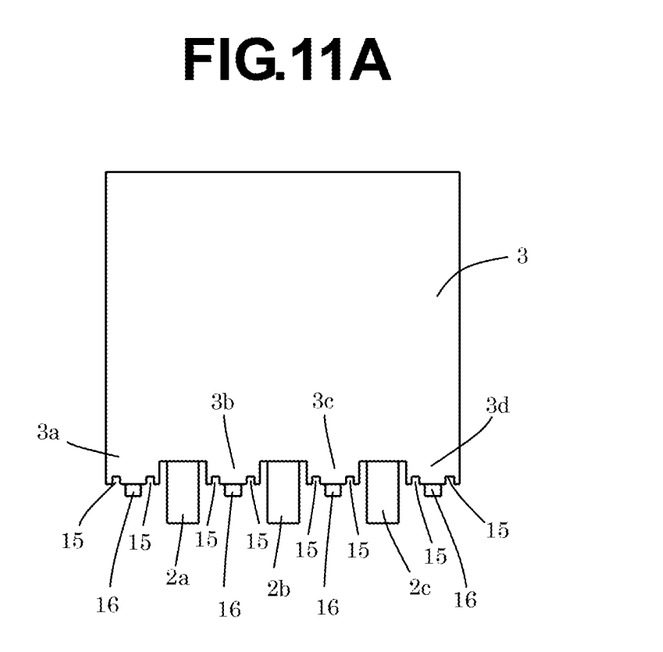
FIG. 11A and FIG. 11B are plan views of a semiconductor device according to a fifth embodiment of the present invention.

FIG. 11A is a plan view of a semiconductor device according to a fifth embodiment of the present invention.

Figure 11B:
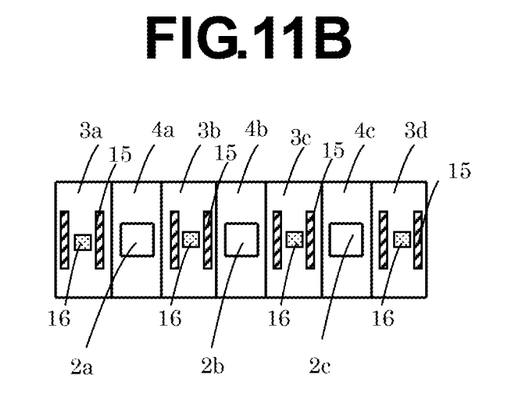

FIG. 11A corresponds to FIG. 10A, and FIG. 11B corresponds to FIG. 10B. The semiconductor device of FIG. 11A and FIG. 11B differ from the semiconductor device of FIG. 10A and FIG. 10B in that the groove portions 15 are formed on both sides of the second resin protruded portions 16. With this configuration, both improvement of junction stability with use of the second resin protruded portions 16 and avoidance of short circuit between terminals with use of the groove portions 15 can be expected.

As described above, the semiconductor device of the present invention includes the resin protruded portions on both the sides of the external terminals, and thus not only the mounting substrate and the external terminals are bonded to each other, but also the mounting substrate and the resin protruded portions are in contact to be fixed to each other. In addition, since the resin protruded portions and the external terminals are connected to each other via the solder fillets, the external terminals are hardly damaged and solder cracks hardly occur even when the semiconductor device is repeatedly applied with vibration from the outside. Further, the external terminals have a straight shape. Thus, a low-cost stamping press mold for performing a lead frame processing that has a cutting punch with a simple shape and a small number of punching may be used for producing the external terminals. Further, the external terminals are short, and hence a number of semiconductor devices of the present invention can be laid out in the surface of the lead frame compared to a conventional lead frame having the same size. Consequently, the number of semiconductor devices per lead frame can be increased, and thus total manufacturing cost of a package can be decreased.

What is claimed is:

1. A semiconductor device having a single inline package, the semiconductor device comprising:
    a resin encapsulation body having side surfaces and a semiconductor device element therein;
    a resin protruded portion extended from only one side surface of the resin encapsulation body;
    a resin cut-out portion adjacent to the resin protruded portion; and
    external terminals connected to the semiconductor device component and extending from the only one side surface of the resin encapsulation body and arranged in the resin cut-out portion,
    wherein a distal end of the external terminals is located farther from the resin encapsulation body than a distal end of the resin protruded portion.

2. The semiconductor device according to claim 1, wherein a side surface of one of the external terminals and an inner side surface of the resin cut-out portion opposing the side surface of the one external terminal are spaced apart from each other.

3. The semiconductor device according to claim 1, wherein the resin protruded portion has a groove portion formed therein, the groove portion being arranged between one of the external terminals and an external terminal adjacent to the one of the external terminals.

4. The semiconductor device according to claim 2, wherein the resin protruded portion has a groove portion formed therein, the groove portion being arranged between one of the external terminals and an external terminal adjacent to the one of the external terminals.

5. The semiconductor device according to claim 1, wherein the resin protruded portion has a second resin protruded portion formed thereon, the second resin protruded portion being arranged between one of the external terminals and an external terminal adjacent to the one of the external terminals.

6. The semiconductor device according to claim 2, wherein the resin protruded portion has a second resin protruded portion formed thereon, the second resin protruded portion being arranged between one of the external terminals and an external terminal adjacent to the one of the external terminals.

7. The semiconductor device according to claim 3, wherein the resin protruded portion has a second resin protruded portion formed thereon, the second resin protruded portion being arranged between one of the external terminals and an external terminal adjacent to the one of the external terminals.

8. The semiconductor device according to claim 4, wherein the resin protruded portion has a second resin protruded portion formed thereon, the second resin protruded portion being arranged between one of the external terminals and an external terminal adjacent to the one of the external terminals.

9. The semiconductor device according to claim 2,
    wherein an inner side surface of the resin cut-out portion is formed so as to have a tapered shape, and
    wherein a gap between the inner side surface and one of the external terminals becomes gradually wider toward the distal end of the one of the external terminals from a base portion of the one of the external terminals.

10. The semiconductor device according to claim 3,
wherein an inner side surface of the resin cut-out portion is formed so as to have a tapered shape, and
wherein a gap between the inner side surface and one of the external terminals becomes gradually wider toward the distal end of the one of the external terminals from a base portion of the one of the external terminals.

11. The semiconductor device according to claim 4,
wherein an inner side surface of the resin cut-out portion is formed so as to have a tapered shape, and
wherein a gap between the inner side surface and one of the external terminals becomes gradually wider toward the distal end of the one of the external terminals from a base portion of the one of the external terminals.

12. The semiconductor device according to claim 2,
wherein an inner side surface of the resin cut-out portion is formed so as to have a stepped shape, and
wherein a gap between the inner side surface and one of the external terminals becomes gradually wider toward the distal end of the one of the external terminals from a base portion of the one of the external terminals.

13. The semiconductor device according to claim 3,
wherein an inner side surface of the resin cut-out portion is formed so as to have a stepped shape, and
wherein a gap between the inner side surface and one of the external terminals becomes gradually wider toward the distal end of the one of the external terminals from a base portion of the one of the external terminals.

14. The semiconductor device according to claim 4,
wherein an inner side surface of the resin cut-out portion is formed so as to have a stepped shape, and
wherein a gap between the inner side surface and one of the external terminals becomes gradually wider toward the distal end of the one of the external terminals from a base portion of the one of the external terminals.

15. The semiconductor device according to claim 2,
wherein an inner side surface of the resin cut-out portion is formed so as to have an arc shape, and
wherein a gap between the inner side surface and one of the external terminals becomes gradually wider toward the distal end of the one of the external terminals from a base portion of the one of the external terminals.

16. The semiconductor device according to claim 3,
wherein an inner side surface of the resin cut-out portion is formed so as to have an arc shape, and
wherein a gap between the inner side surface and one of the external terminals becomes gradually wider toward the distal end of the one of the external terminals from a base portion of the one of the external terminals.

17. The semiconductor device according to claim 4,
wherein an inner side surface of the resin cut-out portion is formed so as to have an arc shape, and
wherein a gap between the inner side surface and one of the external terminals becomes gradually wider toward the distal end of the one of the external terminals from a base portion of the one of the external terminals.

18. The semiconductor device according to claim 1, wherein the external terminals extend away from the only one side surface at a point midway between a bottom surface and a top surface of the resin encapsulation body.

19. The semiconductor device according to claim 18, wherein the external terminals extend in a continuous linear direction from the resin encapsulation body to the distal end thereof.

* * * * *